(12) United States Patent
Chow et al.

(10) Patent No.: US 8,258,015 B2
(45) Date of Patent: Sep. 4, 2012

(54) INTEGRATED CIRCUIT PACKAGE SYSTEM WITH PENETRABLE FILM ADHESIVE

(75) Inventors: Seng Guan Chow, Singapore (SG);
Linda Pei Ee Chua, Singapore (SG);
Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 6 days.

(21) Appl. No.: 12/035,493

(22) Filed: Feb. 22, 2008

(65) Prior Publication Data
US 2009/0212442 A1 Aug. 27, 2009

(51) Int. Cl.
*H01L 23/00* (2006.01)
(52) U.S. Cl. ................. 438/118; 257/E23.001
(58) Field of Classification Search .......... 438/106, 438/118, 119; 257/E23.001
See application file for complete search history.

(56) References Cited

U.S. PATENT DOCUMENTS

| 5,444,296 | A | | 8/1995 | Kaul et al. | |
|---|---|---|---|---|---|
| 5,579,207 | A | | 11/1996 | Hayden et al. | |
| 5,748,452 | A | | 5/1998 | Londa | |
| 5,854,507 | A | | 12/1998 | Miremadi et al. | |
| 5,963,430 | A | | 10/1999 | Londa | |
| 5,982,633 | A | | 11/1999 | Jeansonne | |
| 6,101,100 | A | | 8/2000 | Londa | |
| 6,242,932 | B1 | | 6/2001 | Hembree | |
| 6,529,027 | B1 | | 3/2003 | Akram et al. | |
| 6,555,898 | B2 | | 4/2003 | Wensel | |
| 6,555,917 | B1 | * | 4/2003 | Heo ............................. | 257/777 |
| 6,696,748 | B1 | | 2/2004 | Thurgood | |
| 6,855,574 | B2 | | 2/2005 | Thurgood | |
| 6,861,288 | B2 | | 3/2005 | Shim et al. | |
| 6,992,396 | B2 | * | 1/2006 | Arai et al. ..................... | 257/777 |
| 7,093,358 | B2 | | 8/2006 | Akram et al. | |
| 7,109,574 | B2 | | 9/2006 | Chiu et al. | |
| 7,169,645 | B2 | | 1/2007 | Bolken et al. | |
| 7,187,067 | B2 | | 3/2007 | Weng et al. | |
| 7,247,519 | B2 | * | 7/2007 | Karnezos et al. ............. | 438/110 |
| 7,288,835 | B2 | * | 10/2007 | Yim et al. ..................... | 257/685 |
| 7,501,697 | B2 | * | 3/2009 | Yim et al. ..................... | 257/686 |
| 2002/0030261 | A1 | | 3/2002 | Rolda, Jr. et al. | |
| 2003/0038354 | A1 | * | 2/2003 | Derderian ..................... | 257/685 |
| 2004/0145040 | A1 | * | 7/2004 | Fukuda et al. ................ | 257/687 |
| 2004/0229401 | A1 | * | 11/2004 | Bolken et al. ................ | 438/109 |
| 2005/0090050 | A1 | | 4/2005 | Shim et al. | |
| 2005/0148113 | A1 | * | 7/2005 | Karnezos ...................... | 438/109 |
| 2005/0255628 | A1 | * | 11/2005 | Kinsman ........................ | 438/64 |
| 2006/0076665 | A1 | * | 4/2006 | Kim et al. ..................... | 257/686 |
| 2006/0097402 | A1 | * | 5/2006 | Pu et al. ........................ | 257/777 |
| 2006/0220256 | A1 | | 10/2006 | Shim et al. | |
| 2006/0240595 | A1 | | 10/2006 | Lee et al. | |
| 2006/0244157 | A1 | | 11/2006 | Carson | |
| 2006/0249828 | A1 | * | 11/2006 | Hong ............................. | 257/686 |
| 2006/0275952 | A1 | | 12/2006 | Gowda et al. | |

(Continued)

*Primary Examiner* — Hsien Ming Lee
*Assistant Examiner* — Michele Fan
(74) *Attorney, Agent, or Firm* — Ishimaru & Associates; Mikio Ishimaru; Stanley M. Chang

(57) ABSTRACT

An integrated circuit package system including: providing a wire bonded die with an active side and a bond wire connected thereto; forming a penetrable film adhesive on the active side and partially encapsulating the bond wire; mounting an interposer, having a first functional side facing up away from the wire bonded die and a second functional side facing down toward the wire bonded die and having exposed conductors, over the wire bonded die; providing a substrate and connecting the first functional side by the exposed conductor with an electrical interconnect to the substrate; and encapsulating the wire bonded die, and the penetrable film adhesive with an encapsulation.

24 Claims, 11 Drawing Sheets

U.S. PATENT DOCUMENTS

| | | |
|---|---|---|
| 2007/0069371 A1* | 3/2007 | Iksan et al. ............ 257/706 |
| 2007/0085186 A1* | 4/2007 | Shen ...................... 257/686 |
| 2007/0126097 A1* | 6/2007 | Lin ......................... 257/678 |
| 2007/0145548 A1* | 6/2007 | Park et al. ............. 257/678 |
| 2007/0181990 A1 | 8/2007 | Huang et al. |
| 2007/0187826 A1 | 8/2007 | Shim et al. |
| 2007/0218583 A1* | 9/2007 | Farnworth et al. ...... 438/64 |
| 2007/0218689 A1* | 9/2007 | Ha et al. ................. 438/686 |
| 2007/0246815 A1 | 10/2007 | Lu et al. |
| 2007/0252284 A1 | 11/2007 | Su et al. |
| 2007/0278696 A1 | 12/2007 | Lu et al. |
| 2008/0006947 A1* | 1/2008 | Akiba et al. ........... 257/778 |
| 2008/0157325 A1 | 7/2008 | Chow et al. |
| 2009/0051023 A1* | 2/2009 | Nam et al. ............. 257/686 |

* cited by examiner

INTEGRATED CIRCUIT PACKAGE SYSTEM WITH PENETRABLE FILM ADHESIVE

CROSS-REFERENCE TO RELATED APPLICATION(S)

The present application contains subject matter related to a co-pending U.S. patent application Ser. No. 11/670,714. The related application is assigned to STATS ChipPAC Ltd.

TECHNICAL FIELD

The present invention relates generally to an integrated circuit package system, and more particularly to a system using penetrable film adhesive in various structures.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes which have significant impacts on manufacturing integration, in that they must be generally small, light weight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging and materials engineering and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high speed computer devices which are projected to exceed one TeraHertz (THz) in the near future. The current technologies, materials, equipment, and structures offer challenges to the basic assembly of these new devices while still not adequately addressing cooling and reliability concerns.

The envelope of technical capability of next generation IC package assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a wire bonded die with an active side and a bond wire connected thereto; forming a penetrable film adhesive on the active side and partially encapsulating the bond wire; mounting an interposer, having a first functional side facing up away from the wire bonded die and a second functional side facing down toward the wire bonded die and having exposed conductors, over the wire bonded die; providing a substrate and connecting the first functional side by the exposed conductor with an electrical interconnect to the substrate; and encapsulating the wire bonded die, and the penetrable film adhesive with an encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
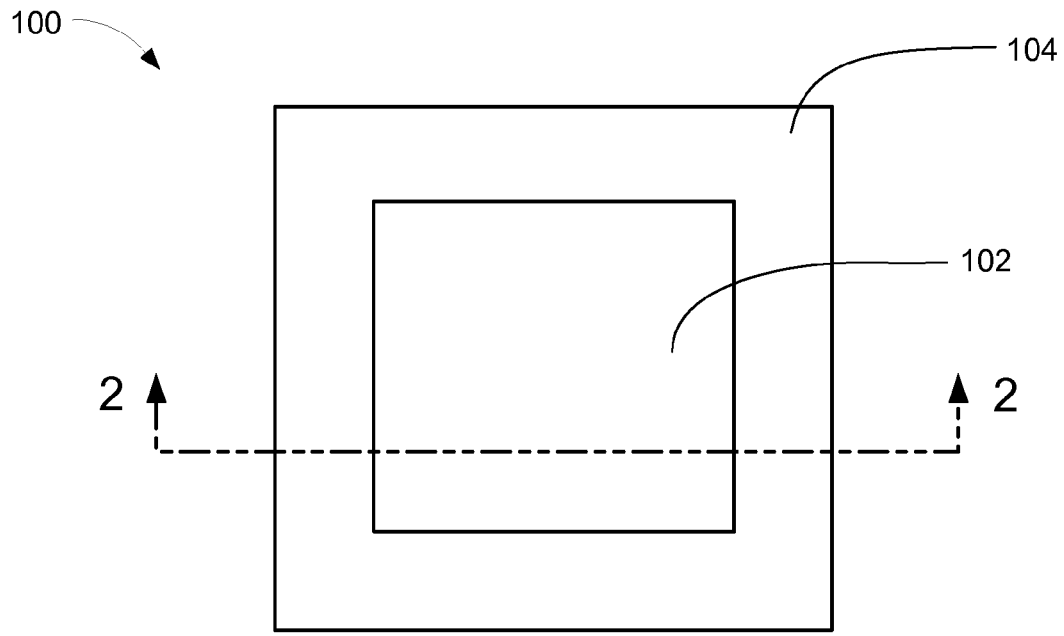
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Similarly, although the views in the drawings for ease of description generally show similar orientations, this depiction in the FIGs. is arbitrary for the most part.

Also, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "system" as used herein refers to and is defined as the method and as the apparatus of the present invention in accordance with the context in which the term is used.

Referring now to FIG. 1, therein is shown a top view of an integrated circuit package system 100 in a first embodiment of the present invention. The integrated circuit package system 100 is shown having a structure such as an interposer 102 and an encapsulation 104. Further, a chip or package may be mounted on the interposer 102.

Figure 2:
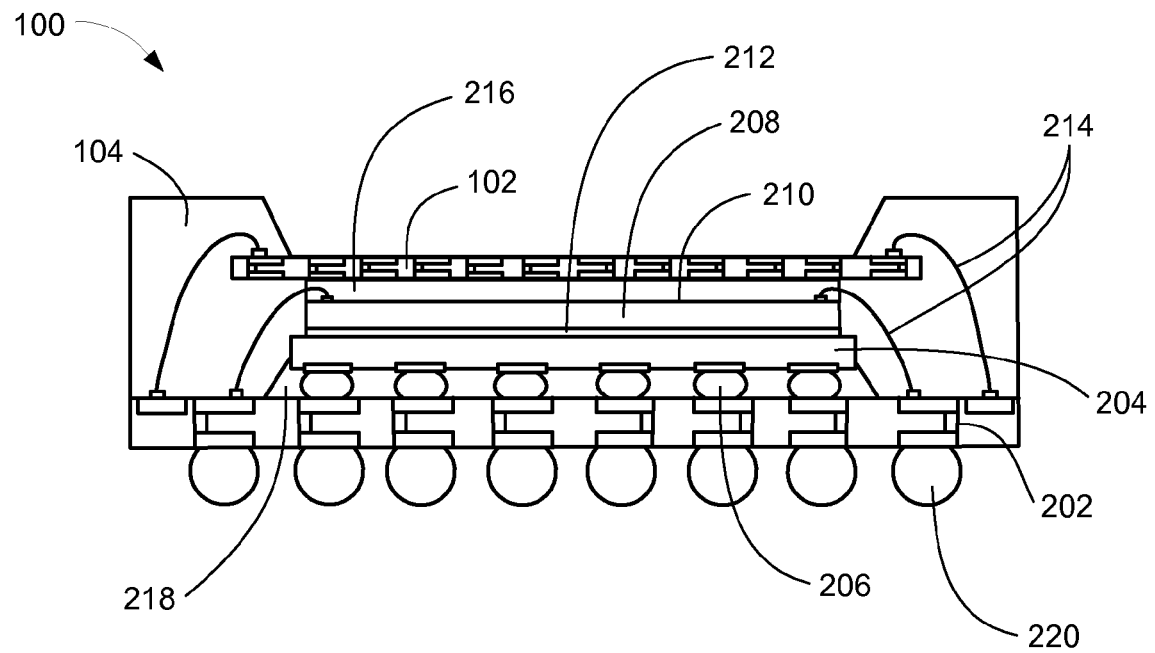
FIG. 2 is a cross sectional view of the integrated circuit package system along the line 2-2 of FIG. 1.

Referring now to FIG. 2, therein is shown a cross sectional view of the integrated circuit package system 100 along the line 2-2 of FIG. 1 in the first embodiment of the present invention. The integrated circuit package system 100 is shown having a substrate 202.

Above the substrate 202 is mounted a flip chip die 204. The flip chip die 204 is attached to the substrate 202 with solder balls 206 between the substrate 202 and the flip chip die 204. Above the flip chip die 204 is mounted a wire bonded die 208 having an active side 210. The wire bonded die 208 is attached to the flip chip die 204 with a die attach adhesive 212 between the flip chip die 204 and the wire bonded die 208.

The active side 210 faces away from the flip chip die 204. From the active side 210 of the wire bonded die 208, electrical interconnects, such as bond wires 214 connect the wire bonded die 208 to the substrate 202. Above the wire bonded die 208, the interposer 102 is adhered with a penetrable film adhesive 216 between the active side 210 and the interposer 102.

The penetrable film adhesive 216 allows for innovative and versatile structure variations when mounting components inside the integrated circuit package system 100 such as mounting larger components over smaller, wire bonded components without spacers.

The penetrable film adhesive 216 has a low viscosity and, as temperature increases, the viscosity gets lower. Therefore, the penetrable film adhesive 216 can be easily pressed over the bond wires 214 and above and around the wire bonded die 208 and then cured to harden the penetrable film adhesive 216.

It has been discovered that the penetrable film adhesive 216 should be a thermally conductive dielectric material. The penetrable film adhesive 216 can be made of a B-stage material that can be hardened after curing and can maintain a predetermined thickness.

It has been unexpectedly discovered that by using the penetrable film adhesive 216 the interposer 102 may be larger than the wire bonded die 208 and still be adhered to the active side 210 of the wire bonded die 208 without contact or deformation of the bond wires 214.

This eliminates the need for offsets of the wire bonded die 208 and the interposer 102, or spacers and additional adhesive layers in the integrated circuit package system 100, while increasing component density and allowing the versatility of using wire bonded chips. Further, the active side 210 may have the bond wires 214 connected on all sides of the wire bonded die 208 without an offset from the interposer 102, allowing for greater connection density and smaller overall package size.

The interposer 102 is further shown electrically connected from above with the bond wires 214 to the substrate 202. The encapsulation 104, such as an epoxy mold compound (EMC) provides mechanical protection and otherwise shields the penetrable film adhesive 216, the flip chip die 204, and the wire bonded die 208 from exposure to the environment.

Optionally, the space between the flip chip die 204 and the substrate 202, an under-fill 218 may be used. Moreover, an external interconnect, such as solder balls 220 is attached beneath the substrate 202. The encapsulation 104 is in direct contact with the penetrable film adhesive 216 and the under-fill 218 on the flip chip die 204, both between the interposer 102 and the substrate 202. The encapsulation 104 is also in direct contact with the wire bonded die 208, the interposer 102, the flip chip die 204, and the substrate 202.

Figure 3:
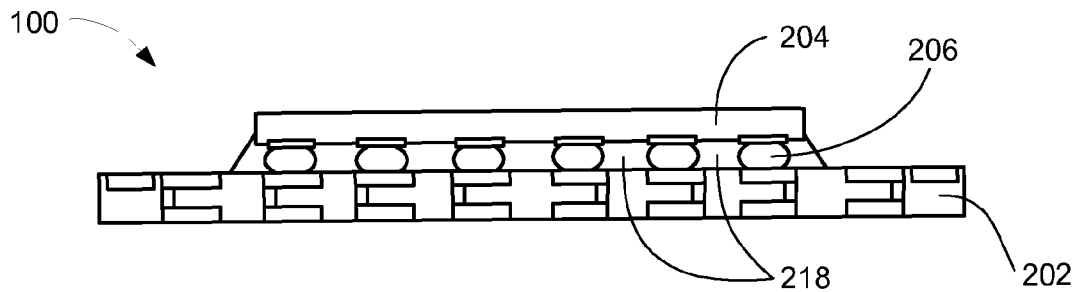
FIG. 3 is the structure of FIG. 2 in an intermediate mounting phase of manufacture.

Referring now to FIG. 3, therein is shown the structure of FIG. 2 in an intermediate mounting phase of manufacture. The intermediate mounting phase depicts the flip chip die 204 mounted to the substrate 202 with an under-fill 218 between the flip chip die 204 and the substrate 202 and attached with solder balls 206.

Figure 4:
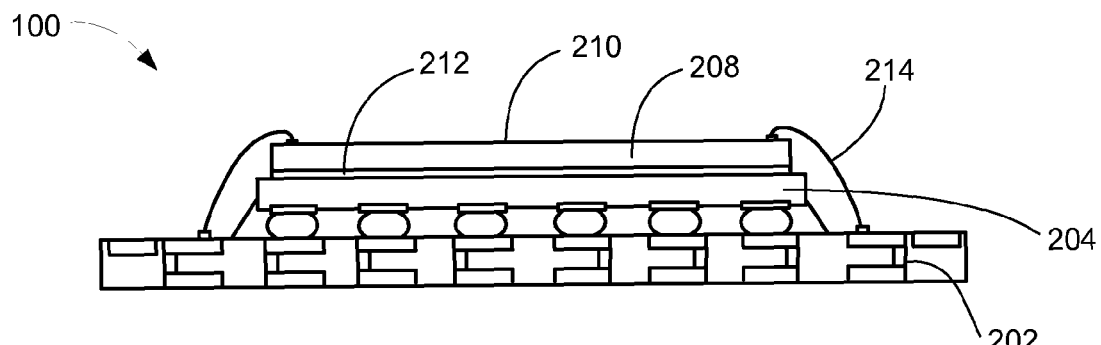
FIG. 4 is the structure of FIG. 3 in a first wire bonding phase of manufacture.

Referring now to FIG. 4, therein is shown the structure of FIG. 3 in a first wire bonding phase of manufacture. The intermediate first wire bonding phase depicts the wire bonded die 208 attached to the flip chip die 204 with the active side 210 facing away from the flip chip die 204.

The active side 210 is also shown with the bond wires 214 attaching the wire bonded die 208 to the substrate 202. The wire bonded die 208 is attached to the flip chip die 204 with the die attach adhesive 212 between the flip chip die 204 and the wire bonded die 208.

Figure 5:
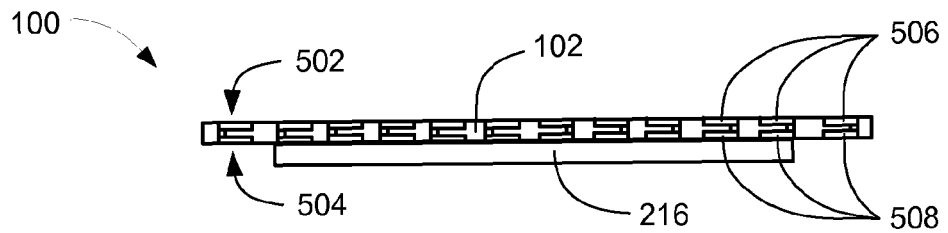
FIG. 5 is the structure of FIG. 2 in an intermediate forming phase of manufacture.

Referring now to FIG. 5, therein is shown the structure of FIG. 2 in an intermediate adhesion forming phase of manufacture. The intermediate adhesion forming phase depicts the interposer 102 with the penetrable film adhesive 216 attached beneath.

The interposer 102 is shown having two functional sides, such as a first functional side 502 and a second functional side 504, which allow for electrical signals to be routed between exposed conductors, such as exposed conductor 506, exposed from the first functional side 502, and exposed conductor 508, exposed from the second functional side 504. The interposer 102 is typically a UV stabilized woven glass and epoxy resin with etched copper conductive pathways.

Figure 6:
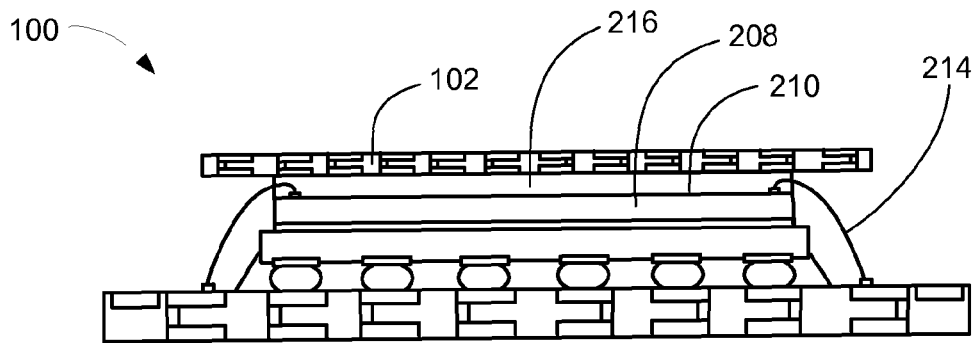
FIG. 6 is the structure of FIG. 4 in an adhering phase of manufacture.

Referring now to FIG. 6, therein is shown the structure of FIG. 4 in an adhering phase of manufacture. The intermediate adhering phase depicts the interposer 102 with the penetrable film adhesive 216 adhered atop the active side 210 of the wire bonded die 208.

This adhering phase clearly shows the bond wires 214 connected to the active side 210 of the wire bonded die 208 without contacting the interposer 102.

Figure 7:
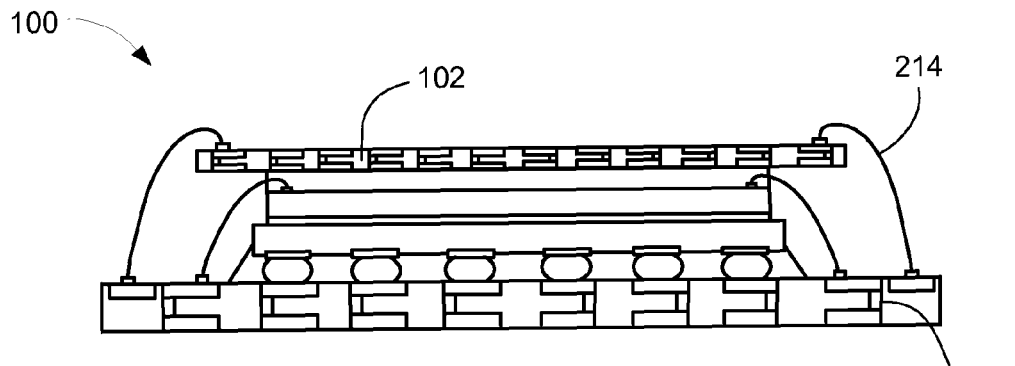
FIG. 7 is the structure of FIG. 6 in a second wire bonding phase of manufacture.

Referring now to FIG. 7, therein is shown the structure of FIG. 6 in a second wire bonding phase of manufacture. The intermediate second wire bonding phase depicts the interposer 102 connected from above to the substrate 202 with the bond wires 214.

Figure 8:
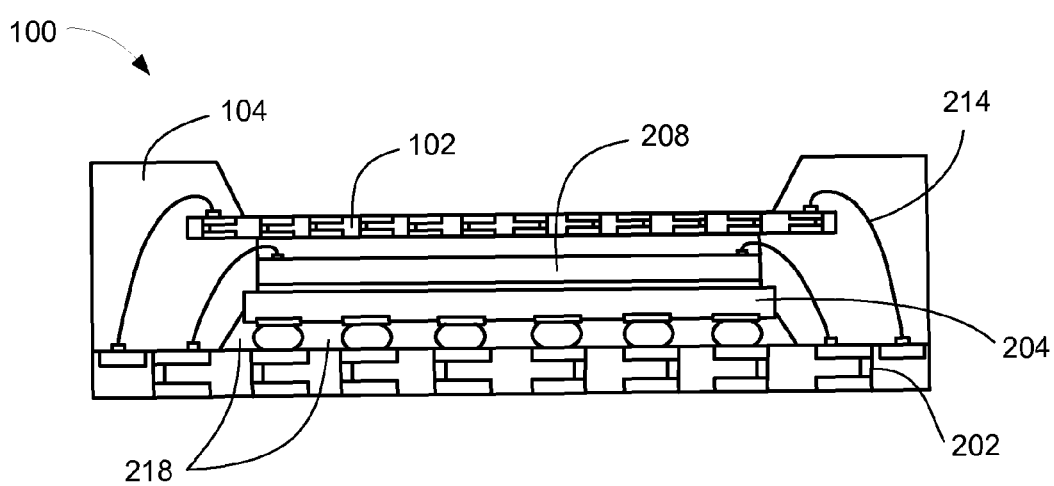
FIG. 8 is the structure of FIG. 7 in an encapsulating phase of manufacture.

Referring now to FIG. 8, therein is shown the structure of FIG. 7 in an encapsulating phase of manufacture. The intermediate encapsulating phase depicts the integrated circuit package system 100 with the encapsulation 104 surrounding the bond wires 214 that attach the interposer 102 to the substrate 202. Further, the encapsulation 104 is shown encapsulating the wire bonded die 208, the flip chip die 204, and the under-fill 218.

Figure 9:
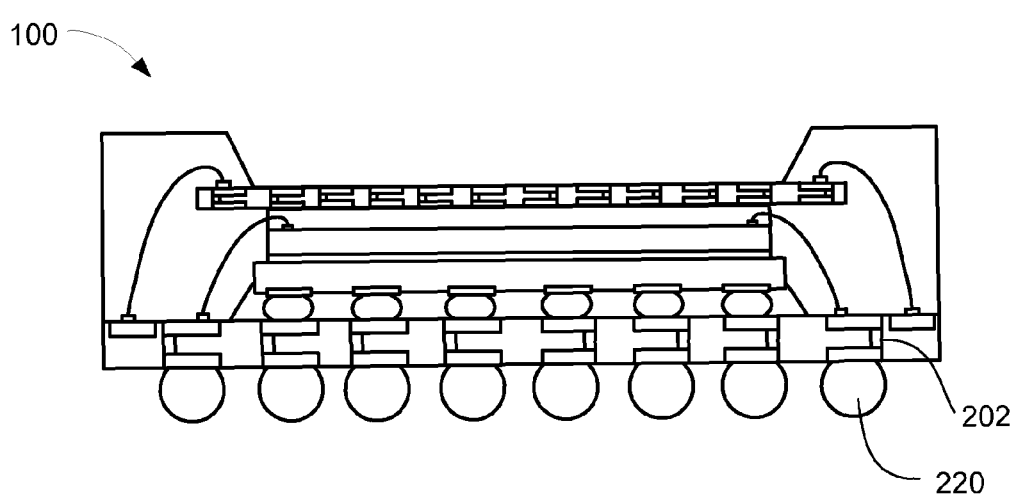
FIG. 9 is the structure of FIG. 8 in an external interconnect attaching phase of manufacture.

Referring now to FIG. 9, therein is shown the structure of FIG. 8 in an external interconnect attaching phase of manufacture. The intermediate external interconnect attaching phase depicts the integrated circuit package system 100 with external interconnects, such as solder balls 220 attached beneath the substrate 202.

Figure 10:
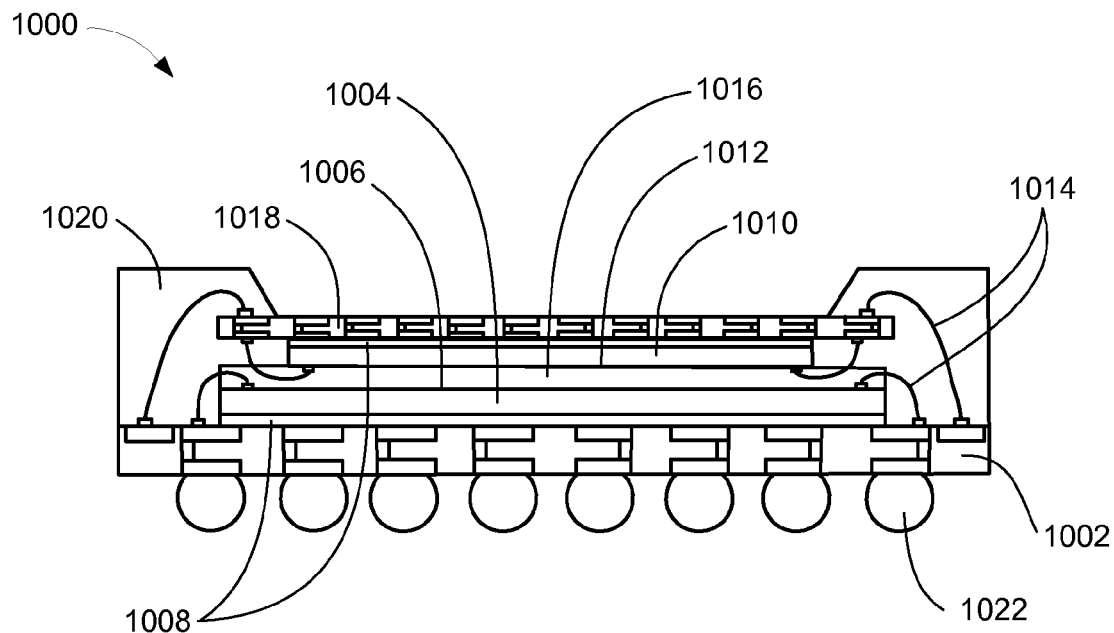
FIG. 10 is a cross sectional view of an integrated circuit package system in a second embodiment of the present invention.

Referring now to FIG. 10, therein is shown a cross sectional view of an integrated circuit package system 1000 in a second embodiment of the present invention. The integrated circuit package system 1000 is shown having a substrate 1002.

Above the substrate 1002 is mounted a structure such as a large wire bonded die 1004 with an active side 1006. The large wire bonded die 1004 is attached to the substrate 1002 with a die attach adhesive 1008 between the large wire bonded die 1004 and the substrate 1002.

Above the large wire bonded die 1004 is mounted a wire bonded die 1010 having an active side 1012. The large wire bonded 1004 is large in respect to the wire bonded die 1010. The wire bonded die 1010 is also centered horizontally above the large wire bonded die 1004.

The smaller size of the wire bonded die 1010 creates a step structure found in many wire bonded packages which allows electrical interconnects, such as bond wires 1014 to be connected to the active side 1006 of the large wire bonded die 1004.

Between the large wire bonded die 1004 and the wire bonded die 1010 is a penetrable film adhesive 1016. The penetrable film adhesive 1016 adheres the active side 1006 of the large wire bonded die 1004 to the active side 1012 of the wire bonded die 1010.

The penetrable film adhesive 1016 allows the wire bonded die 1010 to be mounted with the active side 1012 downward in a novel structural configuration without a step structure, or spacers and additional adhesive layers, allowing for increased component density and the versatility of using wire bonded chips.

The penetrable film adhesive 1016 surrounds the bond wires 1014 near the active side 1006 and the active side 1012. Further, an interposer 1018 is attached above the wire bonded die 1010. The interposer 1018 is attached with the die attach adhesive 1008 between the interposer 1018 and the wire bonded die 1010.

Above the interposer 1018, the bond wires 1014 attach to the interposer 1018 and electrically connect the interposer 1018 to the substrate 1002. An encapsulation 1020, such as an EMC provides mechanical protection and otherwise shields the penetrable film adhesive 1016, the large wire bonded die 1004, and the wire bonded die 1010 from exposure to the environment.

Below the substrate 1002 is mounted an external interconnect, such as solder balls 1022.

Figure 11:
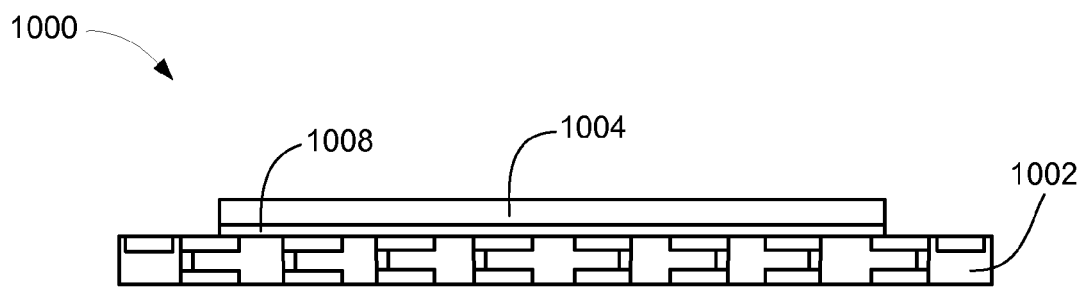
FIG. 11 is the structure of FIG. 10 in an intermediate mounting phase of manufacture.

Referring now to FIG. 11, therein is shown the structure of FIG. 10 in an intermediate mounting phase of manufacture. The intermediate mounting phase depicts the large wire bonded die 1004 mounted to the substrate 1002 with the die attach adhesive 1008 between the large wire bonded die 1004 and the substrate 1002.

Figure 12:
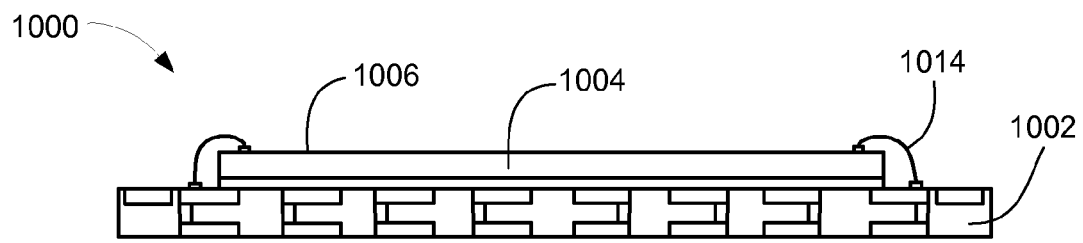
FIG. 12 is the structure of FIG. 11 in a first wire bonding phase of manufacture.

Referring now to FIG. 12, therein is shown the structure of FIG. 11 in a first wire bonding phase of manufacture. The intermediate first wire bonding phase of manufacture depicts the active side 1006 of the large wire bonded die 1004 connected to the substrate 1002 with the bond wires 1014.

Figure 13:
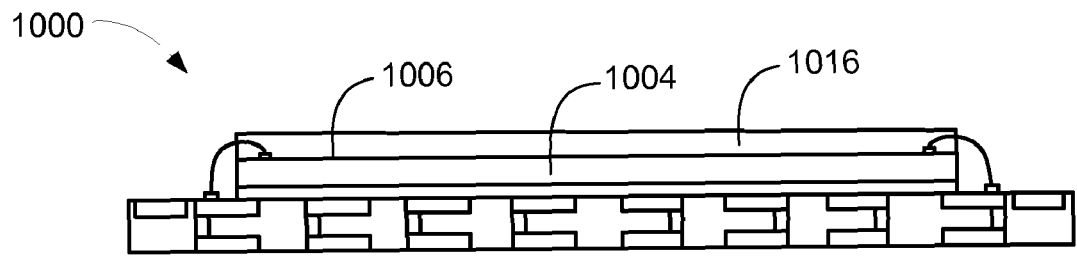
FIG. 13 is the structure of FIG. 12 in an adhesive forming phase of manufacture.

Referring now to FIG. 13, therein is shown the structure of FIG. 12 in an adhesion forming phase of manufacture. The intermediate adhesion forming phase depicts the large wire bonded die 1004 with the penetrable film adhesive 1016 formed on the active side 1006.

Figure 14:
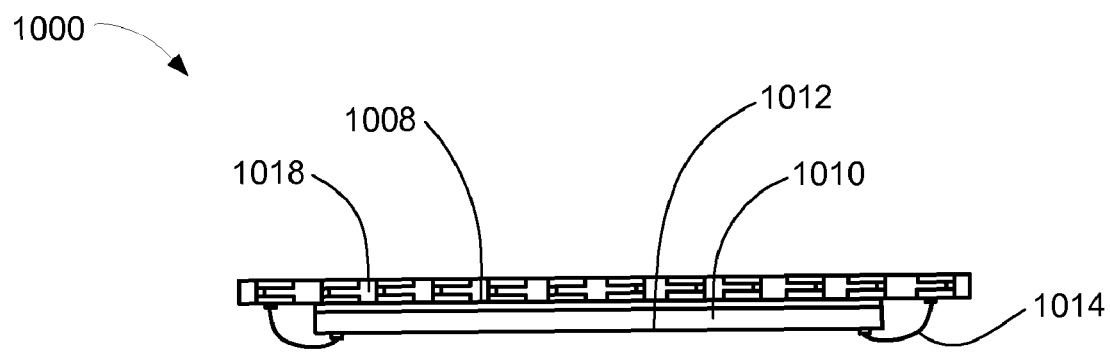
FIG. 14 is the structure of FIG. 10 in an intermediate second wire bonding phase of manufacture.

Referring now to FIG. 14, therein is shown the structure of FIG. 10 in an intermediate second wire bonding phase of manufacture. The intermediate second wire bonding phase of manufacture depicts the interposer 1018 with the wire bonded die 1010 attached beneath, and with the active side 1012 facing away from the interposer 1018.

The wire bonded die 1010 is attached to the interposer 1018 with the die attach adhesive 1008 between the interposer 1018 and the wire bonded die 1010. The active side 1012 of the wire bonded die 1010 is electrically connected to the interposer 1018 with the bond wires 1014.

Figure 15:
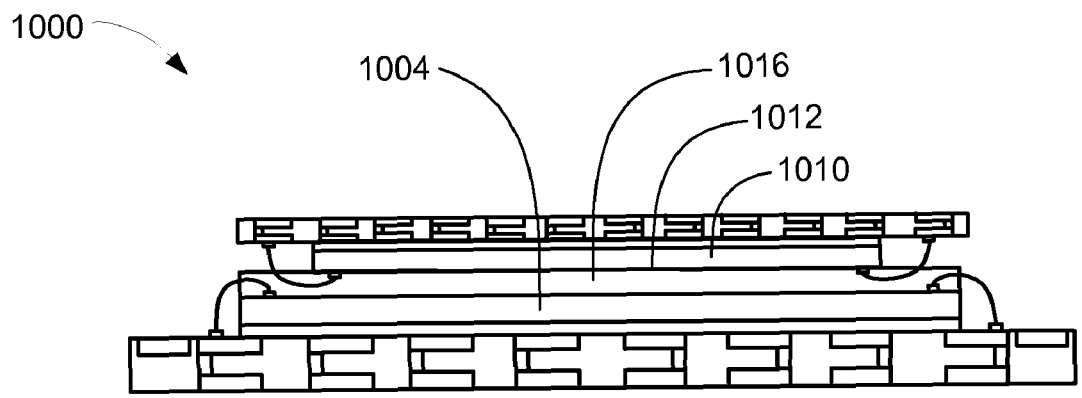
FIG. 15 is the structure of FIG. 13 in an adhering phase of manufacture.

Referring now to FIG. 15, therein is shown the structure of FIG. 13 in an adhering phase of manufacture. The intermediate adhering phase depicts the active side 1012 of the wire bonded die 1010 adhered to the penetrable film adhesive 1016 above the large wire bonded die 1004.

Figure 16:
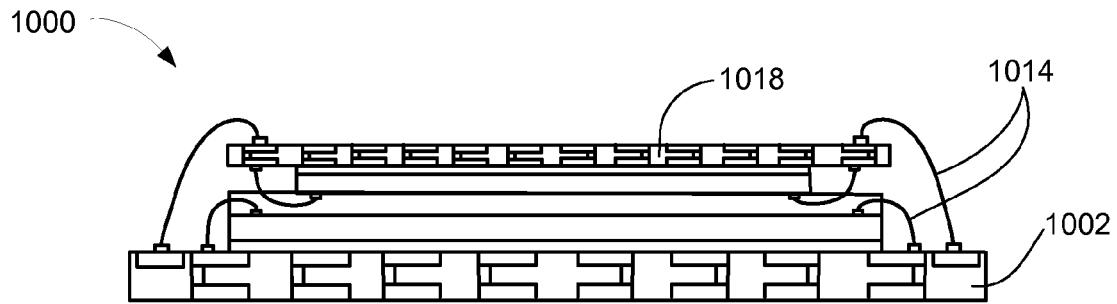
FIG. 16 is the structure of FIG. 15 in a third wire bonding phase of manufacture.

Referring now to FIG. 16, therein is shown the structure of FIG. 15 in a third wire bonding phase of manufacture. The intermediate third wire bonding phase depicts the interposer 1018 connected from above with the bond wires 1014 to the substrate 1002.

Figure 17:
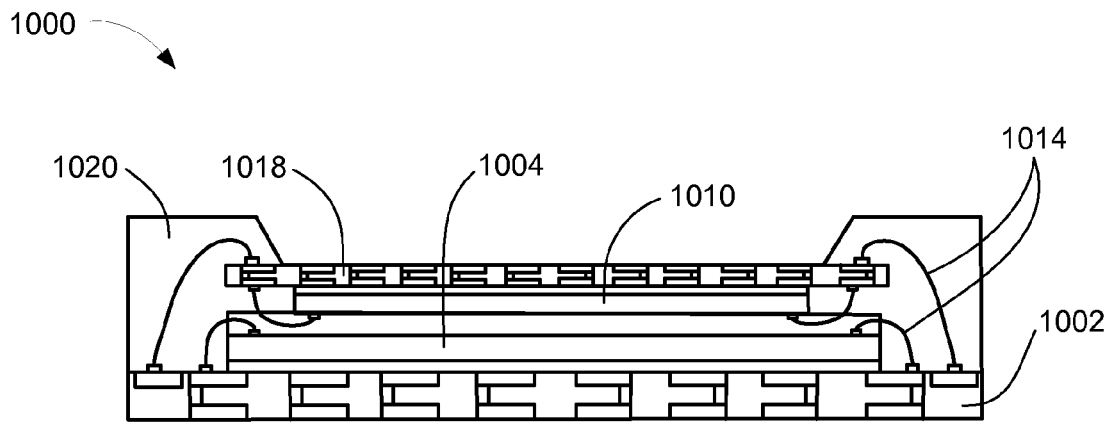
FIG. 17 is the structure of FIG. 16 in an encapsulating phase of manufacture.

Referring now to FIG. 17, therein is shown the structure of FIG. 16 in an encapsulating phase of manufacture. The intermediate encapsulating phase depicts the integrated circuit package system 1000 with the encapsulation 1020 surrounding the bond wires 1014 that attach the interposer 1018 to the substrate 1002. Further, the encapsulation 1020 is shown encapsulating the large wire bonded die 1004, and the wire bonded die 1010.

Figure 18:
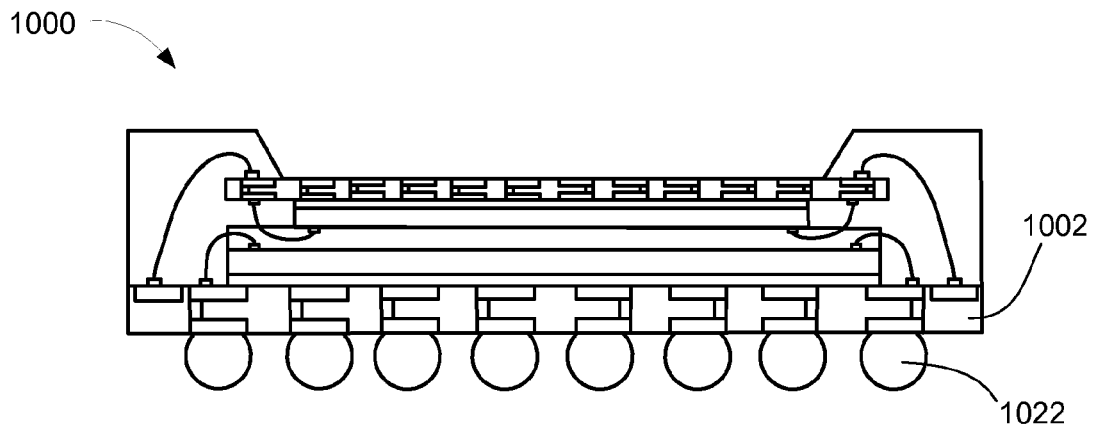
FIG. 18 is the structure of FIG. 17 in an external interconnect attaching phase of manufacture.

Referring now to FIG. 18, therein is shown the structure of FIG. 17 in an external interconnect attaching phase of manufacture. The intermediate external interconnect attaching phase depicts the integrated circuit package system 1000 with external interconnects, such as solder balls 1022 attached beneath the substrate 1002.

Figure 19:
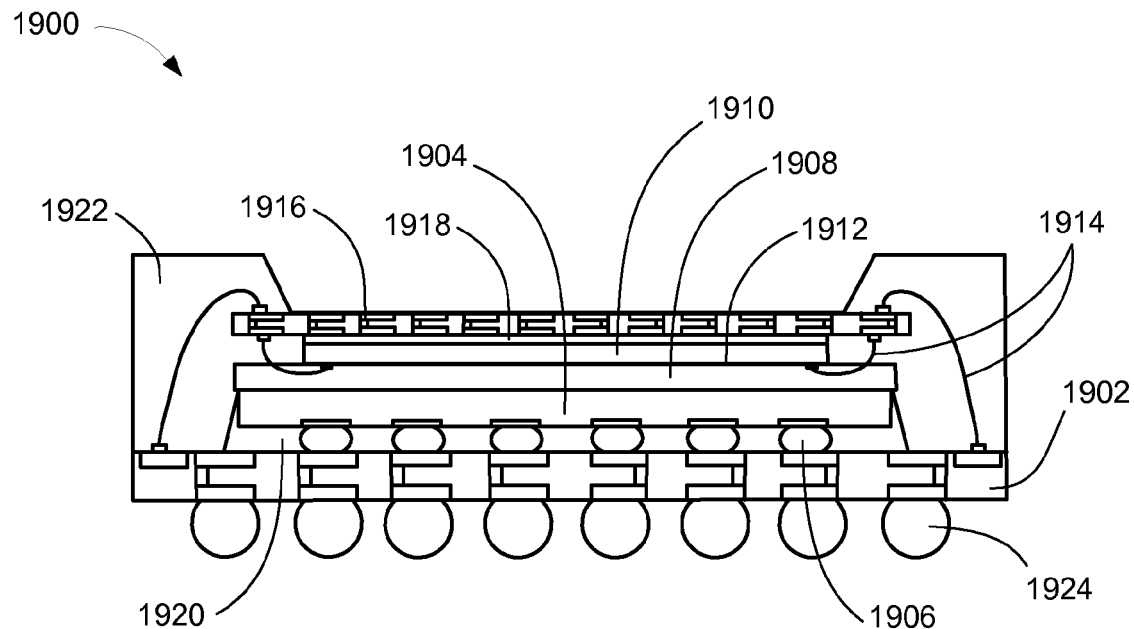
FIG. 19 is a cross sectional view of an integrated circuit package system in a third embodiment of the present invention.

Referring now to FIG. 19, therein is shown a cross sectional view of an integrated circuit package system 1900 in a third embodiment of the present invention. The integrated circuit package system 1900 is shown having a substrate 1902.

Above the substrate 1902 is mounted a structure such as a flip chip die 1904. The flip chip die 1904 is attached to the substrate 1902 with solder balls 1906 between the flip chip die 1904 and the substrate 1902.

Above the flip chip die 1904 is a penetrable film adhesive 1908. Above the penetrable film adhesive 1908 is a wire bonded die 1910 with an active side 1912 facing toward the flip chip die 1904.

The wire bonded die 1910 is shown smaller horizontally than the flip chip die 1904, however, it is understood by those skilled in the art that the wire bonded die 1910 may also be the same size or larger and be consistent with the present invention.

The penetrable film adhesive 1908 allows for the active side 1912 to be connected with electrical interconnects, such as bond wires 1914 while facing the flip chip die 1904 without a step structure, or spacers and additional adhesive layers increasing component density and allowing the versatility of using wire bonded chips.

An interposer 1916 is mounted above the wire bonded die 1910 and the active side 1912 faces away from the interposer 1916. The wire bonded die 1910 is attached to the interposer 1916 with a die attach adhesive 1918 between the wire bonded die 1910 and the interposer 1916. The interposer 1916 is electrically connected from below with the bond wires 1914 to the active side 1912.

Optionally, under-fill 1920 may be used between the flip chip die 1904 and the substrate 1902. The interposer 1916 is electrically connected from above to the substrate 1902 with the bond wires 1914.

Further, encapsulating the flip chip die 1904, and the wire bonded die 1910 is an encapsulation 1922 such as an EMC. External interconnects, such as solder balls 1924 are attached beneath the substrate 1902.

Figure 20:
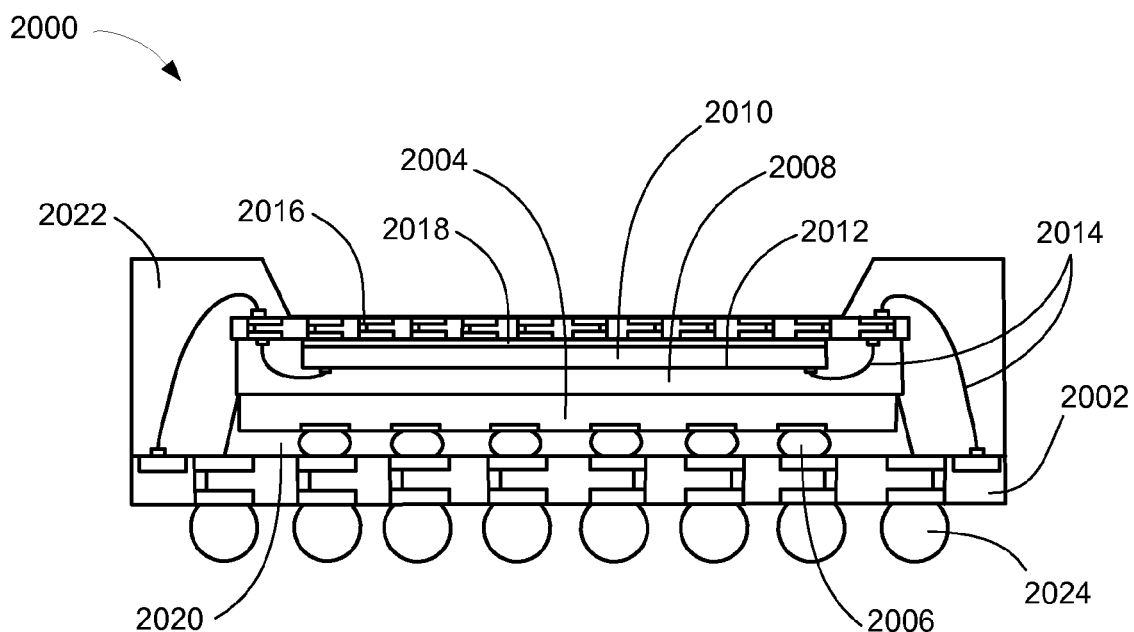
FIG. 20 is a cross sectional view of an integrated circuit package system in a fourth embodiment of the present invention.

Referring now to FIG. 20, therein is shown a cross sectional view of an integrated circuit package system 2000 in a fourth embodiment of the present invention. The integrated circuit package system 2000 is shown having a substrate 2002.

Above the substrate 2002 is mounted a structure such as a flip chip die 2004. The flip chip die 2004 is attached to the substrate 2002 with solder balls 2006 between the flip chip die 2004 and the substrate 2002.

Above the flip chip die 2004 is a penetrable film adhesive 2008. Above the penetrable film adhesive 2008 is a wire bonded die 2010 with an active side 2012 facing toward the flip chip die 2004.

The wire bonded die 2010 is shown smaller horizontally than the flip chip die 2004, however, it is understood by those skilled in the art that the wire bonded die 2010 may also be the same size and be consistent with the present invention.

The penetrable film adhesive 2008 allows for the active side 2012 to be connected with electrical interconnects, such as bond wires 2014 while facing the flip chip die 2004 without a step structure, or spacers and additional adhesive layers increasing component density and allowing the versatility of using wire bonded chips.

An interposer 2016 is mounted above the wire bonded die 2010 and the active side 2012 faces away from the interposer 2016. The wire bonded die 2010 is attached to the interposer 2016 with a die attach adhesive 2018 between the wire bonded die 2010 and the interposer 2016. The interposer 2016 is electrically connected from below with the bond wires 2014 to the active side 2012.

The penetrable film adhesive 2008, between the wire bonded die 2010 and the flip chip die 2004, extends vertically past the active side 2012 of the wire bonded die 2010 to fully encapsulate the bond wires 2014 connecting to the wire bonded die 2010 to the interposer 2016.

Optionally, under-fill 2020 may be used between the flip chip die 2004 and the substrate 2002. The interposer 2016 is electrically connected from above to the substrate 2002 with the bond wires 2014.

Further, encapsulating the flip chip die 2004, and the wire bonded die 2010 is an encapsulation 2022 such as an EMC. External interconnects, such as solder balls 2024 are attached beneath the substrate 2002.

Figure 21:
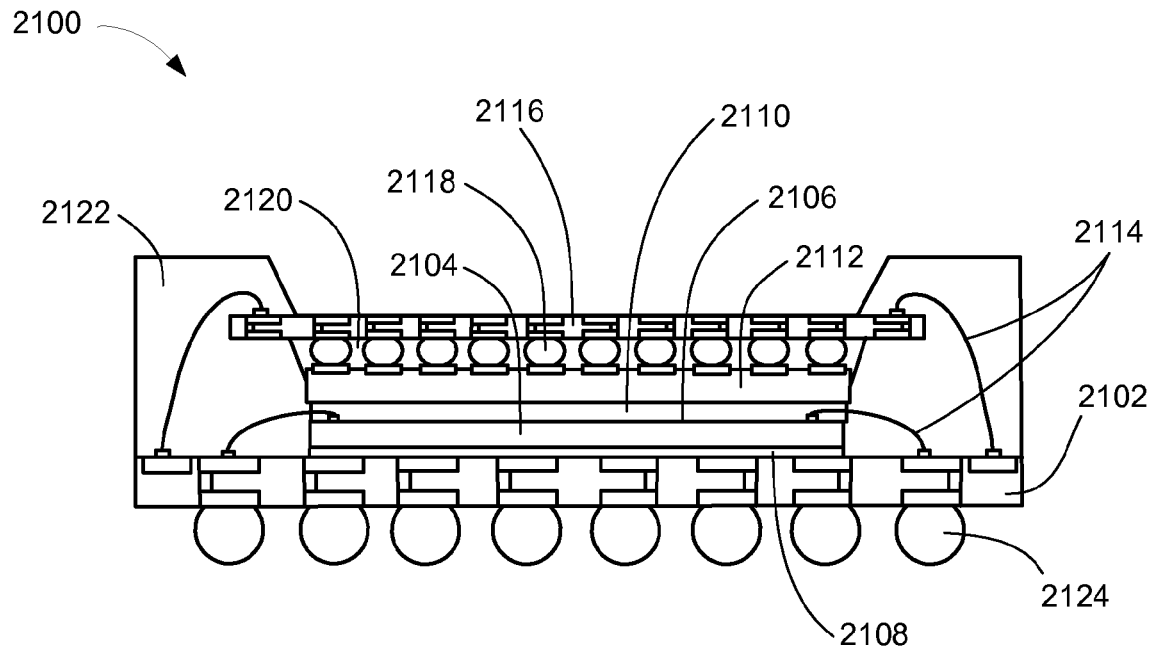
FIG. 21 is a cross sectional view of an integrated circuit package system in a fifth embodiment of the present invention.

Referring now to FIG. 21, therein is shown a cross sectional view of an integrated circuit package system 2100 in a fifth embodiment of the present invention. The integrated circuit package system 2100 is shown having a substrate 2102.

Above the substrate 2102 is mounted a wire bonded die 2104 with an active side 2106. The wire bonded die 2104 is attached to the substrate 2102 with a die attach adhesive 2108 between the wire bonded die 2104 and the substrate 2102. The active side 2106 is shown facing away from the substrate 2102.

Above the wire bonded die 2104 is a penetrable film adhesive 2110. Above the penetrable film adhesive 2110 is a structure such as a flip chip die 2112. The wire bonded die 2104 is shown to be of similar size horizontally as the flip chip die 2112.

The penetrable film adhesive 2110 allows for the active side 2106 to be connected with electrical interconnects, such as bond wires 2114 while facing the flip chip die 2112 without a step structure or additional spacers.

The bond wires 2114 electrically connect the active side 2106 to the substrate 2102. Above the flip chip die 2112 is an interposer 2116. The interposer 2116 is connected to the flip chip die 2112 with solder balls 2118 between the flip chip die 2112 and the interposer 2116. An optional under-fill 2120 may be used between the flip chip die 2112 and the interposer 2116.

The interposer 2116 is electrically connected from above to the substrate 2102 with the bond wires 2114. Further, encapsulating the wire bonded die 2104, and the flip chip die 2112 is an encapsulation 2122 such as an EMC. External interconnects, such as solder balls 2124 are attached beneath the substrate 2102.

Figure 22:
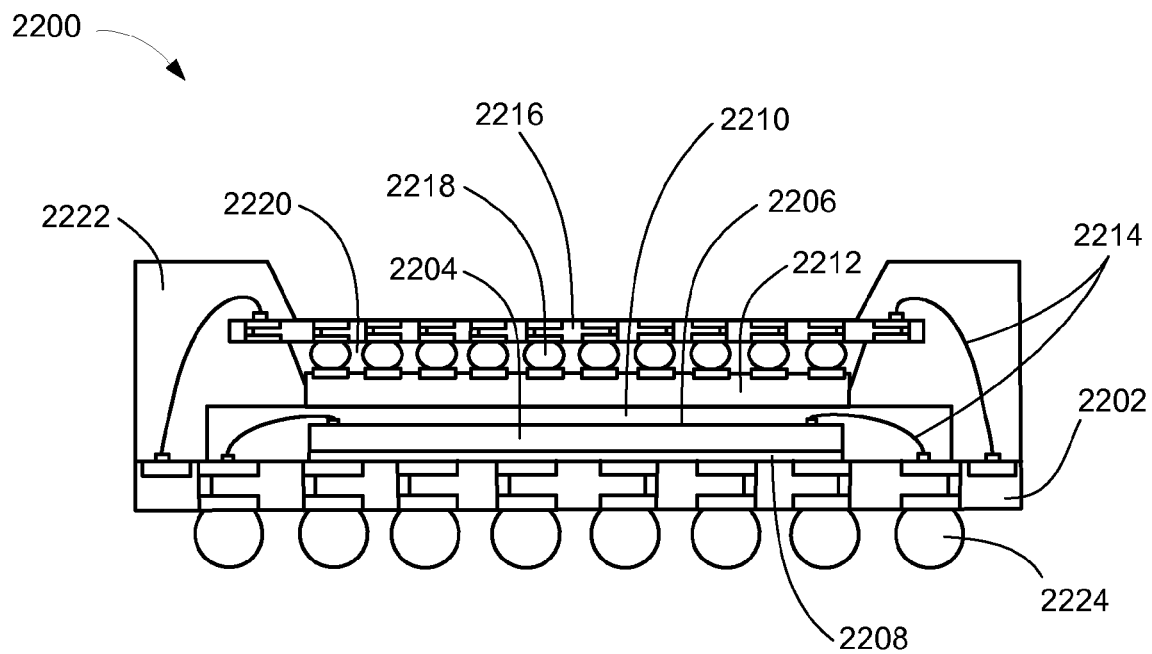
FIG. 22 is a cross sectional view of an integrated circuit package system in a sixth embodiment of the present invention.

Referring now to FIG. 22, therein is shown a cross sectional view of an integrated circuit package system 2200 in a sixth embodiment of the present invention. The integrated circuit package system 2200 is shown having a substrate 2202.

Above the substrate 2202 is mounted a wire bonded die 2204 with an active side 2206. The wire bonded die 2204 is attached to the substrate 2202 with a die attach adhesive 2208 between the wire bonded die 2204 and the substrate 2202. The active side 2206 is shown facing away from the substrate 2202.

Above the wire bonded die 2204 is a penetrable film adhesive 2210. Above the penetrable film adhesive 2210 is a structure such as a flip chip die 2212. The wire bonded die 2204 is shown to be of similar size horizontally as the flip chip die 2212.

The penetrable film adhesive 2210 is shown extending below the active side 2206 to fully encapsulate electrical interconnects, such as bond wires 2214 connecting the active side 2206 to the substrate 2202. The penetrable film adhesive 2210 allows for the active side 2206 to be connected with the bond wires 2214 while facing the flip chip die 2212 without a step structure or additional spacers.

The bond wires 2214 electrically connect the active side 2206 to the substrate 2202. Above the flip chip die 2212 is an interposer 2216. The interposer 2216 is connected to the flip chip die 2212 with solder balls 2218 between the flip chip die 2212 and the interposer 2216. An optional under-fill 2220 may be used between the flip chip die 2212 and the interposer 2216.

The interposer 2216 is electrically connected from above to the substrate 2202 with the bond wires 2214. Further, encapsulating the wire bonded die 2204, and the flip chip die 2212 is an encapsulation 2222 such as an EMC. External interconnects, such as solder balls 2224 are attached beneath the substrate 2202.

Figure 23:
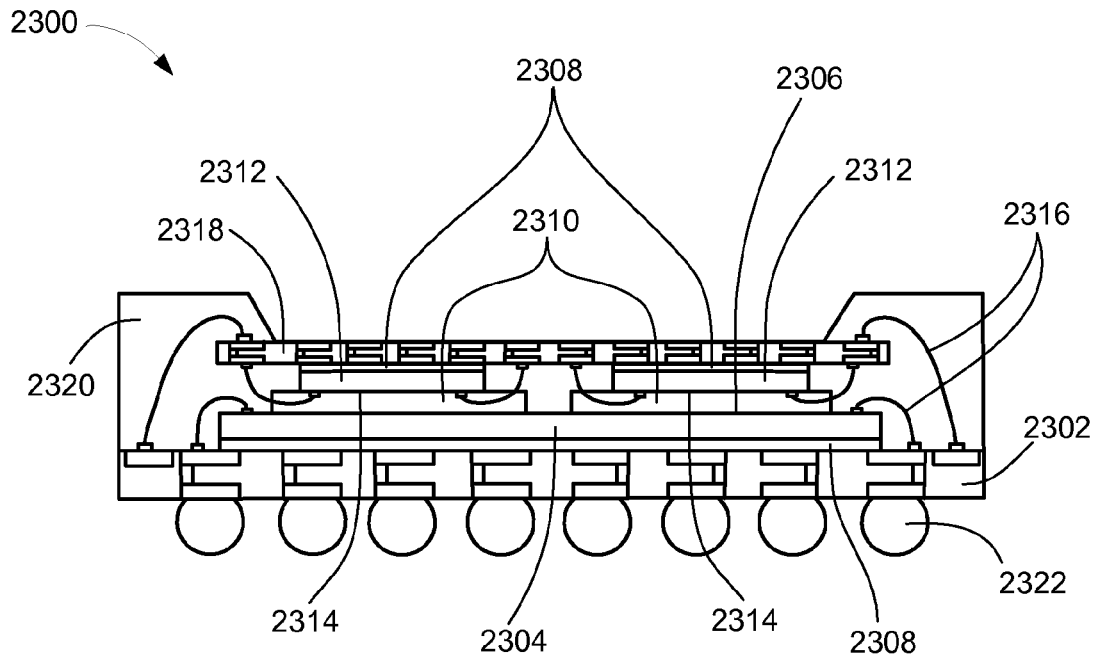
FIG. 23 is a cross sectional view of an integrated circuit package system in a seventh embodiment of the present invention.

Referring now to FIG. 23, therein is shown a cross sectional view of an integrated circuit package system 2300 in a seventh embodiment of the present invention. The integrated circuit package system 2300 is shown having a substrate 2302.

Above the substrate 2302 is mounted a structure such as a large wire bonded die 2304 with an active side 2306. The large wire bonded die 2304 is attached to the substrate 2302 with a die attach adhesive 2308 between the large wire bonded die 2304 and the substrate 2302. The active side 2306 is shown facing away from the substrate 2302.

Above the large wire bonded die 2304 is a penetrable film adhesive 2310 shown in two sections. Above the penetrable film adhesive 2310 are wire bonded dies such as adjacent wire bonded dies 2312. The large wire bonded die 2304 is shown as larger in respect to the adjacent wire bonded dies 2312.

The adjacent wire bonded dies 2312 have active sides 2314 facing toward the active side 2306 of the large wire bonded die 2304. The penetrable film adhesive 2310 allows for the active sides 2314 to be connected with electrical interconnects, such as bond wires 2316 while facing the large wire bonded die 2304 without a step structure or additional spacers.

The active side 2306 of the large wire bonded die 2304 is electrically connected to the substrate 2302 with the bond wires 2316. The penetrable film adhesive 2310 may partially encapsulate the bond wires 2316 electrically connecting the larger wired bonded die 2304 to the substrate 2302. The penetrable film adhesive 2310 may also not encapsulate the bond wires 2316 connecting the large wire bonded die 2304 to the substrate 2302.

The bond wires 2316 also electrically connect the active sides 2314 of the adjacent wire bonded dies 2312 to an interposer 2318. The interposer 2318 is mounted above the adjacent wire bonded dies 2312 and attached to the adjacent wire bonded dies 2312 with die attach adhesive 2308 between the adjacent wire bonded dies 2312 and the interposer 2318.

The active sides 2314 of the adjacent wire bonded dies 2312 face away from the interposer 2318 toward the substrate 2302. The interposer 2318 is electrically connected from above to the substrate 2302 with the bond wires 2316. Further, encapsulating the large wire bonded die 2304, and the adjacent wire bonded dies 2312 is an encapsulation 2320 such as an EMC. External interconnects, such as solder balls 2322 are attached beneath the substrate 2302.

Figure 24:
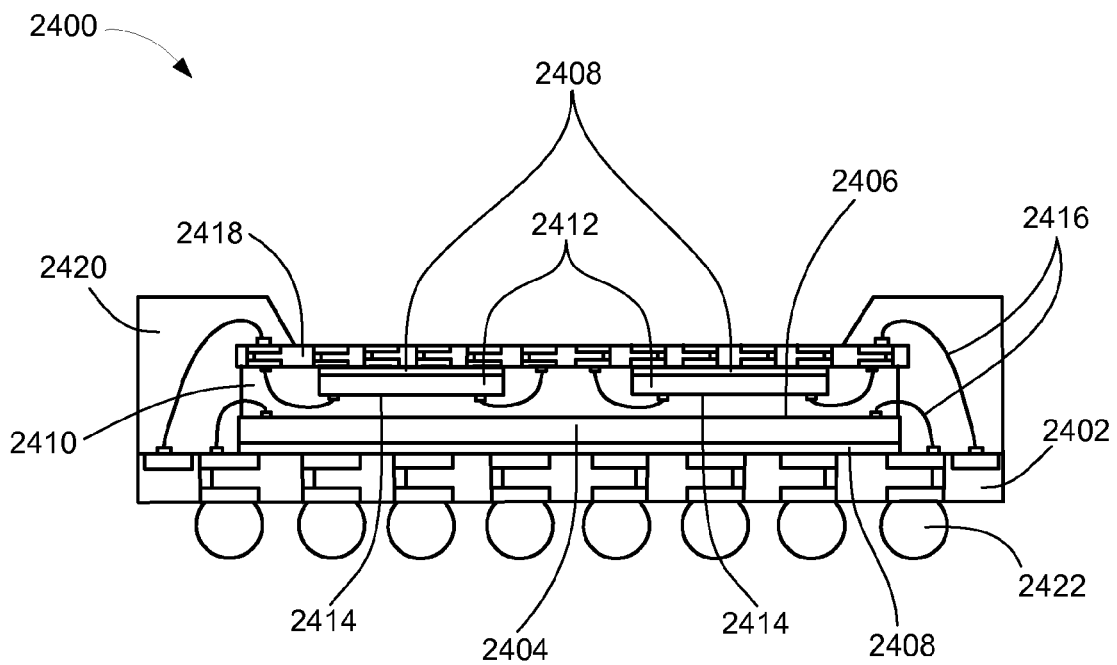
FIG. 24 is a cross sectional view of an integrated circuit package system in a eighth embodiment of the present invention.

Referring now to FIG. 24, therein is shown a cross sectional view of an integrated circuit package system 2400 in an eighth embodiment of the present invention. The integrated circuit package system 2400 is shown having a substrate 2402.

Above the substrate 2402 is mounted a structure such as a large wire bonded die 2404 with an active side 2406. The large wire bonded die 2404 is attached to the substrate 2402 with a die attach adhesive 2408 between the large wire bonded die 2404 and the substrate 2402. The active side 2406 is shown facing away from the substrate 2402.

Above the large wire bonded die 2404 is a penetrable film adhesive 2410. Partially encapsulated with the penetrable film adhesive 2410 and above the large wire bonded die 2404 are wire bonded dies such as adjacent wire boded dies 2412. The large wire bonded die 2404 is shown as larger in respect to the adjacent wire bonded dies 2412.

The adjacent wire bonded dies 2412 have active sides 2414 facing toward the active side 2406 of the large wire bonded die 2404. The penetrable film adhesive 2410 allows for the active sides 2414 to be connected with electrical interconnects, such as bond wires 2416 while facing the large wire bonded die 2404 without a step structure or additional spacers.

The active side 2406 of the large wire bonded die 2404 is electrically connected to the substrate 2402 with the bond wires 2416. The penetrable film adhesive 2410 is shown fully encapsulating the bond wires 2416 attaching to the active side 2414 of the adjacent wired bonded dies 2412. The penetrable film adhesive 2410 is also shown partially encapsulating, near the active side 2406, the bond wires 2416 connecting the large wire bonded die 2404 to the substrate 2402.

The bond wires 2416 also electrically connect the active sides 2414 of the adjacent wire bonded dies 2412 to an interposer 2418. The interposer 2418 is mounted above the adjacent wire bonded dies 2412 and attached to the adjacent wire bonded dies 2412 with the die attach adhesive 2408 between the adjacent wire bonded dies 2412 and the interposer 2418.

The active sides 2414 of the adjacent wire bonded dies 2412 face away from the interposer 2418 toward the substrate 2402. The interposer 2418 is electrically connected from above to the substrate 2402 with the bond wires 2416. Further, encapsulating the large wire bonded die 2404, and the adjacent wire bonded dies 2412 is an encapsulation 2420 such as an EMC. External interconnects, such as solder balls 2422 are attached beneath the substrate 2402.

Figure 25:
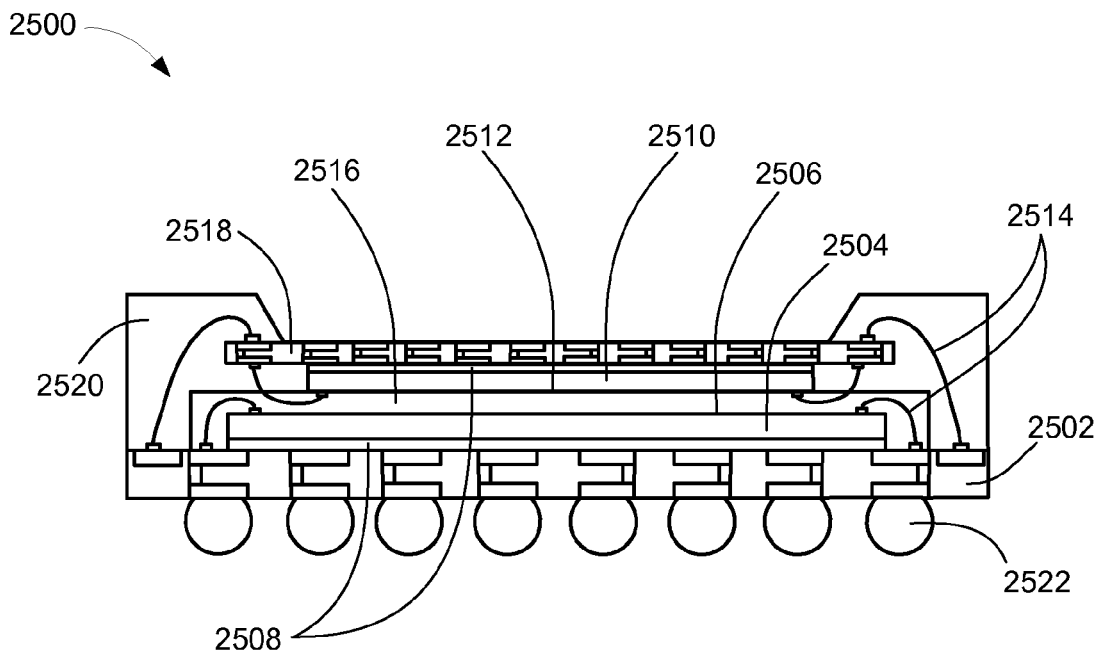
FIG. 25 is a cross sectional view of an integrated circuit package system in a ninth embodiment of the present invention.

Referring now to FIG. 25, therein is shown a cross sectional view of an integrated circuit package system 2500 in a ninth embodiment of the present invention. The integrated circuit package system 2500 is shown having a substrate 2502.

Above the substrate 2502 is mounted a structure such as a large wire bonded die 2504 with an active side 2506. The large wire bonded die 2504 is attached to the substrate 2502 with a die attach adhesive 2508 between the large wire bonded die 2504 and the substrate 2502.

Above the large wire bonded die 2504 is mounted a wire bonded die 2510 having an active side 2512. The large wire bonded 2504 is large in respect to the wire bonded die 2510. The wire bonded die 2510 is also centered horizontally above the large wire bonded die 2504.

The smaller size of the wire bonded die 2510 creates a step structure found in many wire bonded packages which allows electrical interconnects, such as bond wires 2514 to be connected to the active side 2506 of the large wire bonded die 2504.

Between the large wire bonded die 2504 and the wire bonded die 2510 is a penetrable film adhesive 2516. The penetrable film adhesive 2516 adheres the active side 2506 of the large wire bonded die 2504 to the active side 2512 of the wire bonded die 2510.

The penetrable film adhesive 2516 allows the wire bonded die 2510 to be mounted with the active side 2512 downward in a novel structural configuration without a step structure, or spacers and additional adhesive layers, allowing for increased component density and the versatility of using wire bonded chips.

The penetrable film adhesive 2516 fully encapsulates the bond wires 2514 connecting the active side 2506 of the large wire bonded die 2504 to the substrate 2502. The penetrable film adhesive 2516 surrounds the bond wires 2514 near the active side 2512 of the wire bonded die 2510.

Further, an interposer 2518 is attached above the wire bonded die 2510. The interposer 2518 is attached with the die attach adhesive 2508 between the interposer 2518 and the wire bonded die 2510.

Above the interposer 2518, the bond wires 2514 attach to the interposer 2518 and electrically connect the interposer 2518 to the substrate 2502. An encapsulation 2520, such as an EMC provides mechanical protection and otherwise shields the penetrable film adhesive 2516, the large wire bonded die 2504, and the wire bonded die 2510 from exposure to the environment.

Below the substrate 2502 is mounted an external interconnect, such as solder balls 2522.

Figure 26:
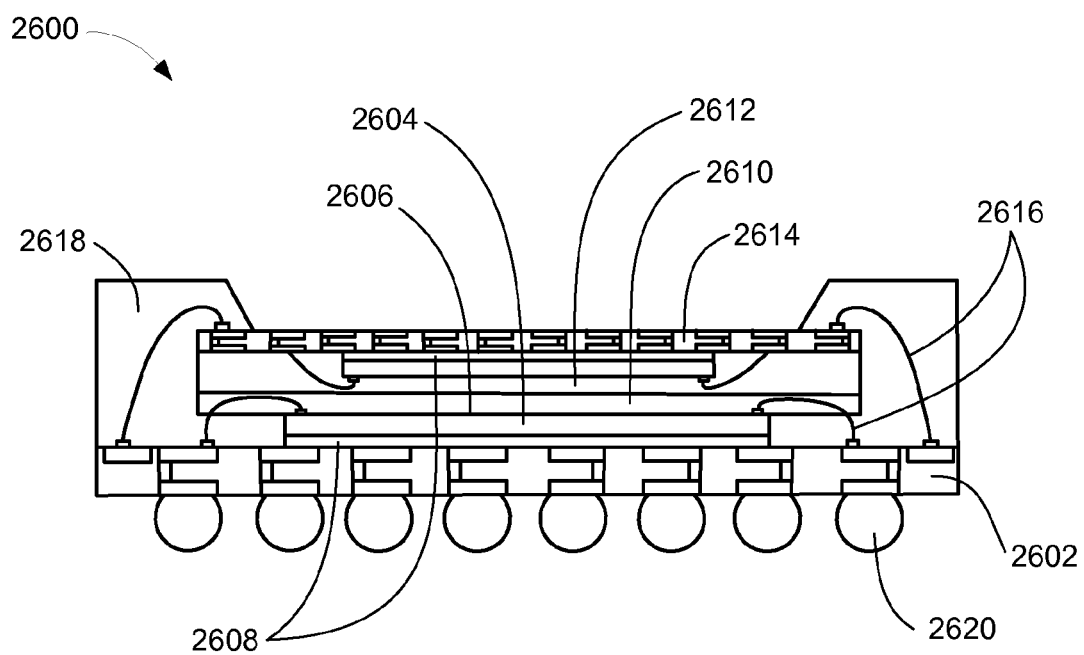
FIG. 26 is a cross sectional view of an integrated circuit package system in a tenth embodiment of the present invention.

Referring now to FIG. 26, therein is shown a cross sectional view of an integrated circuit package system 2600 in a tenth embodiment of the present invention. The integrated circuit package system 2600 is shown having a substrate 2602.

Above the substrate 2602 is mounted a wire bonded die 2604 with an active side 2606. The wire bonded die 2604 is attached to the substrate 2602 with a die attach adhesive 2608 between the wire bonded die 2604 and the substrate 2602. The active side 2606 is shown facing away from the substrate 2602.

Above the wire bonded die 2604 is a penetrable film adhesive 2610. Above the penetrable film adhesive 2610 is a structure such as an inner stacking module (ISM) 2612 in combination with an interposer 2614. The wire bonded die 2604 is shown as smaller size horizontally compared with the larger ISM 2612.

The penetrable film adhesive 2610 allows the wire bonded die 2604 to be connected with electrical interconnects, such as bond wires 2616 while facing the larger ISM 2612 in a novel structural configuration without additional spacers and process steps.

The penetrable film adhesive 2610 is shown covering the width of the ISM 2612 and partially encapsulating the bond wires 2616 connecting the active side 2606 to the substrate 2602 near the active side 2606. The bond wires 2616 also electrically connect the ISM 2612 from the interposer 2614 to the substrate 2602.

Further, encapsulating the wire bonded die 2604, and the penetrable film adhesive 2610 is an encapsulation 2618 such as an EMC. External interconnects, such as solder balls 2620 are attached beneath the substrate 2602.

Figure 27:
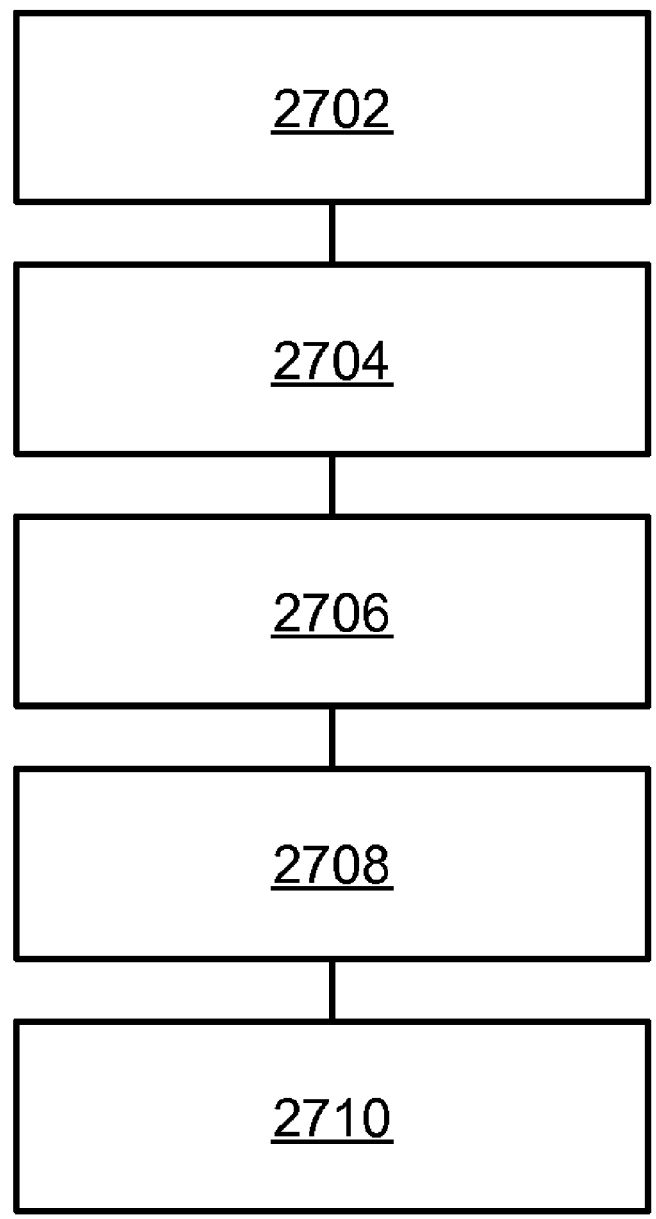
FIG. 27 is a flow chart of an integrated circuit package system for manufacture of an integrated circuit package system in an embodiment of the present invention.

Referring now to FIG. 27, therein is shown a flow chart of an integrated circuit package system 2700 for manufacture of an integrated circuit package system in an embodiment of the present invention. The integrated circuit package system 2700 includes providing a wire bonded die with an active side and connecting a bond wire to the active side in a block 2702; forming a penetrable film adhesive on the active side in a block 2704; mounting an interposer over the wire bonded die, having a first functional side facing up away from the wire bonded die and a second functional side facing down toward the wire bonded die and having exposed conductors in a block 2706; providing a substrate and connecting the first functional side by the exposed conductor with an electrical interconnect to the substrate in a block 2708; and encapsulating the wire bonded die, and the penetrable film adhesive with an encapsulation in a block 2710.

Thus, it has been discovered that the penetrable film adhesive 216 of the present invention furnishes important and heretofore unknown and unavailable solutions, capabilities, and functional aspects for integrated circuit chip packaging. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method for manufacturing an integrated circuit package system comprising:
   providing a substrate;

providing a wire bonded die over the substrate with the wire bonded die having an active side and a bond wire connected thereto;

adhering a penetrable film adhesive on the active side;

attaching a second die to the wire bonded die;

mounting an interposer over the wire bonded die, having a first functional side facing up away from the wire bonded die and a second functional side facing down toward the wire bonded die, the first functional side and the second functional side both having exposed conductors;

connecting the exposed conductors on the first functional side with electrical interconnects to the substrate; and encapsulating the wire bonded die, the second die, and the penetrable film adhesive with an encapsulation in direct contact with both the penetrable film adhesive and an underfill on the second die, wherein the penetrable film adhesive and the underfill are both located between the interposer and the substrate.

2. The method as claimed in claim 1 wherein adhering the penetrable film adhesive on the active side includes partially encapsulating the bond wire by the penetrable film adhesive.

3. The method as claimed in claim 1 wherein adhering the penetrable film adhesive on the active side includes fully encapsulating the bond wire by the penetrable film adhesive.

4. The method as claimed in claim 1 wherein providing the wire bonded die includes connecting the bond wire to the substrate.

5. The method as claimed in claim 1 wherein mounting the interposer over the wire bonded die includes connecting the bond wire to the interposer.

6. A method for manufacturing an integrated circuit package system comprising:

providing a substrate;

providing a wire bonded die over the substrate with the wire bonded die having an active side and a bond wire connected thereto;

adhering a penetrable film adhesive on the active side;

attaching a second die to the wire bonded die;

mounting an interposer having a size equal to or larger than a size of the wire bonded die, opposite the active side, with the interposer having a first functional side facing up away from the wire bonded die and a second functional side facing down toward the wire bonded die, the first functional side and the second functional side both having exposed conductors;

connecting the exposed conductors on the first functional side with electrical interconnects to the substrate; and encapsulating the wire bonded die, the second die, and the penetrable film adhesive with an encapsulation in direct contact with both the penetrable film adhesive and an underfill on the second die, wherein the penetrable film adhesive and the underfill are both located between the interposer and the substrate.

7. The method as claimed in claim 6 further comprising:

providing a wire bonded die includes providing adjacent wire bonded dies, each with the active side; and connecting a further bond wire to each of the active side of the adjacent wire bonded dies.

8. The method as claimed in claim 6 wherein adhering the penetrable film adhesive on the active side includes fully encapsulating the bond wire by the penetrable film adhesive.

9. The method as claimed in claim 6 wherein encapsulating the wire bonded die, the second die, and the penetrable film adhesive with an encapsulation includes encapsulating the wire bonded die and the second die with the encapsulation in direct contact with the wire bonded die, the second die, and the interposer.

10. The method as claimed in claim 6 wherein adhering a penetrable film adhesive includes pressing the penetrable film adhesive over the bond wire.

11. An integrated circuit package system comprising:

a substrate;

a wire bonded die over the substrate with the wire bonded die having an active side;

a bond wire conned to the active side;

a penetrable film adhesive formed on the active side;

a second die attached to the wire bonded die;

an interposer mounted over the wire bonded die, having a first functional side facing up away from the wire bonded die and a second functional side facing down toward the wire bonded die, the first functional side and the second functional side both having exposed conductors;

electrical interconnects connecting the substrate and the exposed conductors on the first functional side;

an underfill on the second die; and an encapsulation in direct contact with both the penetrable film adhesive and the underfill, wherein the penetrable film adhesive and the underfill are both located between the interposer and the substrate, and the encapsulation is over the wire bonded die, the second die, and the penetrable film adhesive.

12. The system as claimed in claim 11 wherein the bond wire is partially encapsulated by the penetrable film adhesive.

13. The system as claimed in claim 11 wherein the bond wire is fully encapsulated by the penetrable film adhesive.

14. The system as claimed in claim 11 wherein the bond wire is connected to the substrate.

15. The system as claimed in claim 11 wherein the bond wire is connected to the interposer.

16. The system as claimed in claim 11 wherein the interposer has a size equal to or larger than a size of the wire bonded die.

17. The system as claimed in claim 16 further comprising:

adjacent wire bonded dies each with an active side; and a further bond wire connected to each of the active side of the adjacent wire bonded dies.

18. The system as claimed in claim 16 wherein the bond wire is fully encapsulated by the penetrable film adhesive.

19. The system as claimed in claim 16 wherein the encapsulation is in direct contact with the wire bonded die, the second die, and the interposer.

20. The system as claimed in claim 16 wherein the penetrable film adhesive has characteristics of being pressed over the bond wire.

21. The system of claim 11 wherein the second die is a flip chip mounted to the wire bond die.

22. The system of claim 21 further comprising a solder ball connecting the substrate and the second die.

23. The system of claim 22 wherein the underfill is between the second die and the substrate.

24. The system of claim 21 wherein the second die is mounted between the wire bonded die and the interposer and connected to the interposer with solder balls.

* * * * *

UNITED STATES PATENT AND TRADEMARK OFFICE
CERTIFICATE OF CORRECTION

| | | Page 1 of 1 |
|---|---|---|
| PATENT NO. | : 8,258,015 B2 | |
| APPLICATION NO. | : 12/035493 | |
| DATED | : September 4, 2012 | |
| INVENTOR(S) | : Chow et al. | |

It is certified that error appears in the above-identified patent and that said Letters Patent is hereby corrected as shown below:

In the Claims:

Column 14, claim 11, line 14, delete "a bond wire conned to the active side;" and insert therefor --a bond wire connected to the active side;--

Signed and Sealed this
Fifth Day of August, 2014

Michelle K. Lee
*Deputy Director of the United States Patent and Trademark Office*